(12) United States Patent
Zhou et al.

(10) Patent No.: US 8,248,063 B2
(45) Date of Patent: Aug. 21, 2012

(54) OPEN LOOP MAGNETO-RESISTIVE MAGNETIC FIELD SENSOR

(75) Inventors: Yuchen Zhou, San Jose, CA (US); Grace Gorman, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 351 days.

(21) Appl. No.: 12/583,253

(22) Filed: Aug. 17, 2009

(65) Prior Publication Data

US 2011/0037458 A1    Feb. 17, 2011

(51) Int. Cl.
*G01R 35/00* (2006.01)
(52) U.S. Cl. ............... 324/202; 324/117 R; 324/252
(58) Field of Classification Search ............ 324/117 R, 324/202, 252
See application file for complete search history.

(56) References Cited

U.S. PATENT DOCUMENTS

| | | | |
|---|---|---|---|
| 5,438,257 A | 8/1995 | Berkcan | |
| 5,570,034 A | 10/1996 | Needham et al. | |
| 6,376,933 B1 * | 4/2002 | Goetz et al. | 307/91 |
| 7,259,545 B2 * | 8/2007 | Stauth et al. | 324/117 R |
| 2006/0170529 A1 | 8/2006 | Shoji | |
| 2008/0186023 A1 * | 8/2008 | Biziere et al. | 324/252 |
| 2009/0115412 A1 * | 5/2009 | Fuse | 324/252 |

OTHER PUBLICATIONS

Co-pending US Patent HT09-001, U.S. Appl. No. 12/456,306, filed Jun. 15, 2009, "Elimination of Errors Due to Aging in Magneto-Resistive Devices," assigned to the same assignee as the present invention, 22 pages.

* cited by examiner

*Primary Examiner* — Arleen M Vazquez
(74) *Attorney, Agent, or Firm* — Saile Ackerman LLC; Stephen B. Ackerman

(57) ABSTRACT

An apparatus and a general method to measure a magnetic field using magneto-resistive sensors in an open-loop configuration are disclosed. A key feature is the regular in-situ normalization of the sensors to compensate for the effects of sensor aging.

9 Claims, 4 Drawing Sheets

US 8,248,063 B2

OPEN LOOP MAGNETO-RESISTIVE MAGNETIC FIELD SENSOR

Related application HT09-001 file Ser. No. 12/456,306 filed on Jun. 15, 2009, discloses methods for normalizing MR sensors to compensate for the effects of aging. It is herein incorporated, by reference, in its entirety.

FIELD OF THE INVENTION

The invention relates to the general field of magnetic measurements with particular reference to measuring magnetic field strength and correcting such measurements for the effects of sensor aging.

BACKGROUND OF THE INVENTION

When magneto-resistive (MR) sensors are used in an open-loop mode for magnetic field sensing, the field value is derived directly from the MR sensor's resistance. This requires an accurate resistance reference point and accurate estimation of the sensor sensitivity to the external field. MR sensors, especially tunneling magneto-resistance (TMR) sensors, can show large resistance changes after exposure to long term stresses that are significant enough to affect the sensing accuracy. However, when sensor resistance is normalized relative to the max, min, or mean values of each sensor's transfer curve, the resulting population shifts and inter-sensor variations can be fully compensated for. Long-term accurate open-loop operation is therefore possible if normalized values of this sort are used.

When used for magnetic field sensing, MR sensors have the advantage of much higher sensitivity when compared to the conventional Hall sensors that are being used in today's commercial products. State-of-the-art magnetic tunnel junction (MTJ) sensors can be an order of magnitude more sensitive than Hall sensors. This suggests the possibility of employing magnetic field sensing in applications that were originally not achievable by Hall sensors. For example, MR sensors [1-2] have been used to sense the magnetic field generated by an electric current i.e. as current sensors.

FIG. 1 shows an open-loop configuration of the prior art wherein a current source powers MR sensor 9 and the voltage across the sensor is compared to reference voltage $V_{ref}$, which (preferably) is the same as the sensor 9 voltage when there is no external magnetic field present. Thus, output voltage $V_{out}$ is proportional to the resistance change of the sensor 9. If the sensor 9 resistance has a reasonably linear response to the external field, $V_{out}$ will then be a measure of the magnetic field at sensor 9. Circuits such as that shown in FIG. 1 are limited by the fact that they use the resistance of the MR sensor directly. Open-loop structures, such as FIG. 1, are sensitive to absolute resistance fluctuations in which the resistance shifts during operation, for example through thermal, electrical and mechanical stresses. These will directly affect the accuracy of the measurement. Furthermore, even though, in some cases, the prior art has devised ways to deal with short-term sensitivity variations of this sort, long-term resistance shifts over time are considered to be an even more serious drawback for the FIG. 1 open-loop scheme.

FIG. 2 illustrates how the zero field resistance, $R_0$, of two (randomly selected) TMR sensors can change over time during which they were in power-on mode and thereby exposed to a stress temperature significantly greater than room temperature. Seen there is an average resistance increase of ~4.5% over the initial zero field resistance values as well as a difference of ~1% between the resistance increases of the two devices. This data indicates that, if changes of this type go uncorrected, open-loop schemes such as the one seen in FIG. 1 will certainly suffer accuracy degradation over time.

REFERENCES

[1] J. Stauth, R. Dickinson, G. Forrest, and R. Vig, "Integrated Sensor," U.S. Pat. No. 7,259,545 B2 (2007)
[2] S. Shoji, "Current Sensor," US Patent Pub. # US 2006/0170529 A1 (2006)

A routine search of the prior art was performed with the following references of interest being found:

In U.S. Pat. No. 5,570,034 Needham et al. disclose a magnetic field sensor and a reference magnetic field sensor coupled in series. In U.S. Pat. No. 5,438,257 Berkcan shows a current sensor and a reference sensor.

SUMMARY OF THE INVENTION

It has been an object of at least one embodiment of the present invention to provide a practical method for open-loop magnetic field sensing using MR sensors.

Another object of at least one embodiment of said method has been to facilitate using in-situ normalization to eliminate the effect of MR sensor resistance shift after long time stress.

Still another object of at least one embodiment of the present invention has been to provide an in-situ calibration method for characterizing MR sensor sensitivity.

A further object of at least one embodiment of the present invention has been to provide apparatus for implementing said methods.

A still further object of at least one embodiment of the present invention has been to improve the accuracy of two-sensor field measurement methods.

These objects have been achieved by the disclosure of two methods to generate normalizing factors that may be applied to any magneto-resistive sensor for correcting changes to their outputs that have occurred as a result of aging (particularly after being subjected to stresses of one sort or another). Both methods depend on placing the sensor in a determined state. The latter is defined as any state of the sensor that is associated with the sensor being in a particular magnetic environment such as, for example, saturation.

DESCRIPTION OF THE PREFERRED EMBODIMENTS

Figure 1:
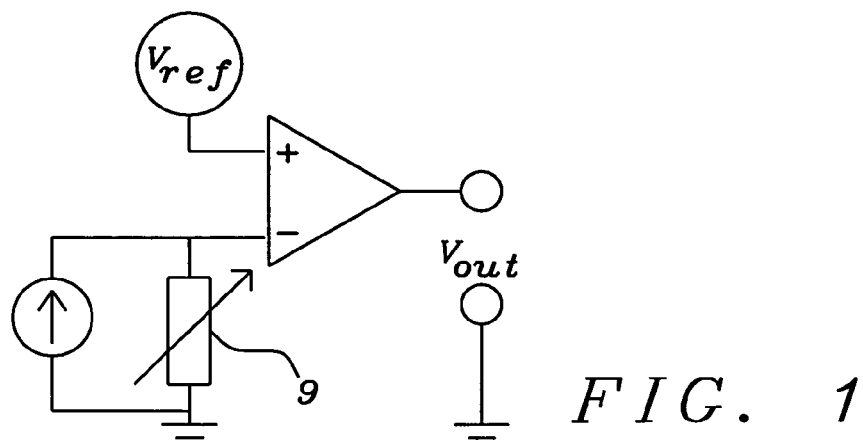
FIG. 1 illustrates a prior art applications of MR sensors.
Figure 2:
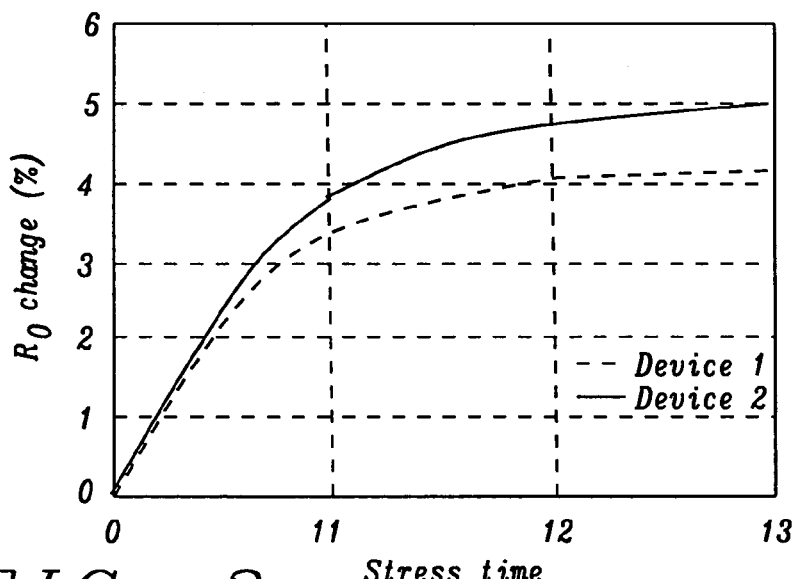
FIG. 2 shows how the resistance of an MR device may increase over time due to aging effects.
Figure 3A:
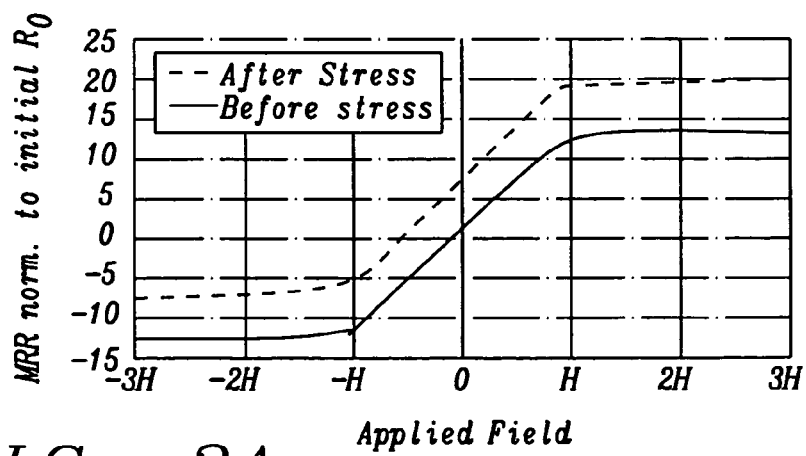
FIG. 3A illustrates the upward drift of an MR sensor resistance vs. applied field curve as the sensor ages.

FIG. 3A shows MR sensor resistance vs. applied field curves for a MTJ sensor. The sensor is exposed for an extended period to high temperature stress while in power-on mode. The dotted and solid curves represent the after and before stress measurement respectively. The shift of the dotted curve towards a higher resistance state relative to the solid curve reflects the same resistance increase at time t3 vs time 0 in FIG. 2. Such resistance increases cause inaccuracy in magnetic field sensing as noted above.

Figure 3B:
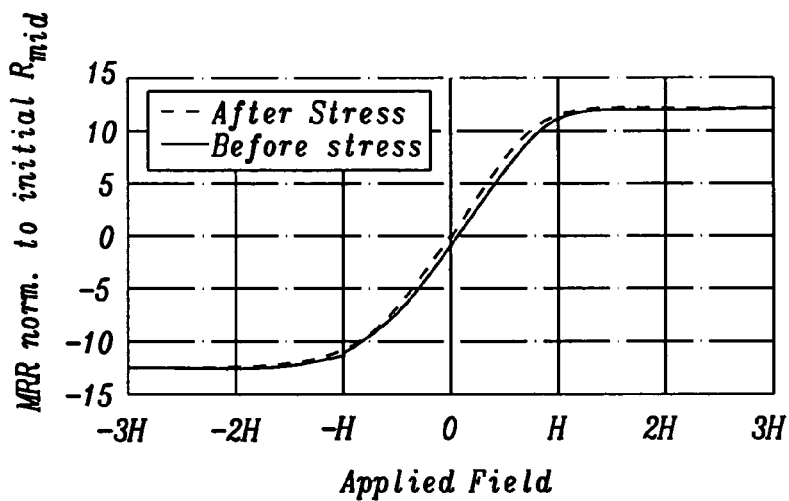
FIG. 3B shows how changes due to aging can be corrected through application of a normalizing factor.

FIG. 3B shows the same two curves when each has been normalized by its own resistance mean value, which is calculated by averaging the maximum and minimum resistance values from each of the curves at +3H and −3H fields (3H being sufficient to put the device into saturation i.e. into a reproducible state). The resulting curves as shown in FIG. 3B are almost exactly over-lapping and show insignificant relative vertical shift.

Thus, instead of using sensor resistance as the field measurement physical quantity, the normalized resistance is a better parameter for measuring magnetic field, as it is insensitive to resistance baseline shifts due to long term stress.

Figure 4:
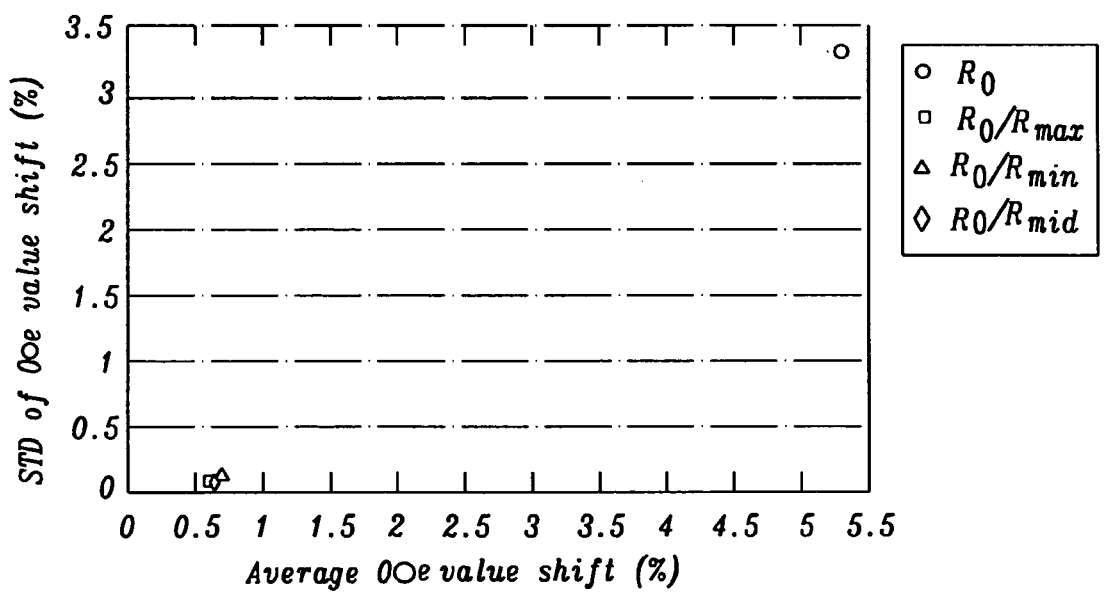
FIG. 4 illustrates how the normalization method reduces errors associated with aging effects.

FIG. 4 illustrates the effectiveness of resistance normalization for minimizing any stress induced resistance shifts. A total of 20 MTJ sensors were stressed with power-on and high temperature conditions for an extended period of time. The X axis in FIG. 4 represents the averaged zero field value (ZFV) shift of the population in percentage relative to the initial ZFV of the sensors. The Y axis is then the standard deviation (STD) of the ZFV shift as a percentage of the initial ZFV. The four different markers in FIG. 4 represent the ZFV shift STD vs. ZFV average shift values for sensor resistance without normalization (○), sensor resistance normalized to its maximum (□), minimal (Δ) or median (◊) values along the transfer curves of each sensor.

Without normalization, the average ZFV of the sensor shows an increase of ~5.2% relative to initial ZFV with an STD of the ZFV increase of ~3.2%. If sensor resistance is used as a direct measurement of the target magnetic field, the ZFV shift will present a maximum of 9~10% error for a close-loop sensor configuration and a maximum of also 10% error for an open-loop configuration. However, when the sensor resistance is normalized to the max/min/mean values along the transfer curves, the averaged shift in normalized ZFV is 0.7~0.8% with 0.1% STD. Thus the maximum error is ~0.3% for a close-loop and <1% for an open-loop sensor configuration. To apply this finding to actual measurements, we therefore use this normalization technique each time before measuring a set of external field values, thereby reducing the measurement error caused by resistance shift from long time operation and/or from external stresses.

To implement in-situ normalization during sensor operation, a magnetic field generation coil is inserted adjacent to the MR sensor. Before using the MR sensor to measure an external field, the necessary current is passed through the added coil to place the sensor in the selected determined state. In most cases the determined state that is selected will be the device's saturation state in which the sensor's resistance is a maximum or a minimum, depending on the direction of the saturating field.

In the curves shown in FIG. 3, the total field at the sensor should be beyond the +H or −H points. Additionally, once sensor resistance values in the saturated states, i.e. $R_{max}$ and $R_{min}$, have been stored, $R_{mean}$ can be calculated and stored. The added coil's field can then be turned off, leaving in place only the field that is to be measured and then normalized by means of the stored $R_{max}$, $R_{min}$ or $R_{mean}$ values.

Note that, in general, an effective normalization factor could be any linear combination of the $R_{max}$, and $R_{min}$ and that saturation is not necessarily the only possible determined state. Another example of a determined state would be the output at zero field i.e. the resistance half way up the resistance vs. applied field curve. Other examples include, but are not limited to, any magnetic field that can be precisely re-established at the MR sensor each time the latest normalization factor is to be computed.

With the normalization method, the reference point (commonly the zero field point) for the normalized resistance can still be achieved with a conventional voltage or resistance reference circuit that reflect the normalized resistance at zero field. However, it is preferably a MR sensor that has the same magnetic and resistive properties as the MR sensor used for sensing the magnetic field, but that is fully isolated from the field so that it produces no magnetic response to the field. It is, however, still experiencing the same electrical, thermal, and mechanical stresses as the active sensor and so will show similar resistance changes over time as the active sensor. With the reference sensor, the average shift (such as in FIG. 4) can be eliminated leaving only minute relative variations to affect the detection accuracy.

The coil that is used for normalization purposes, can also be used to provide an in-situ sensitivity calibration of the sensor. If this coil is accurately positioned near the sensor, so that its (accurately pre-calibrated) field at the sensor (for a given current) can be reliably reproduced, the coil's field can then be utilized for accurate in-situ calibration of the sensor's output as a function of field strength. In this way the accuracy of the open-loop MR sensor can be even further improved.

The advantages of the invention include:
1. The disclosed normalization method significantly reduces errors due to sensor resistance shifts, making open-loop MR sensing feasible despite sensor resistance baseline shift from long term stress
2. In-situ sensitivity calibration enhances sensing accuracy and reduces sensitivity variation effects after long time operation or stress
3. Use of a reference sensor further offsets the resistance shift effect and enhances sensing accuracy Problems Solved:
(a) Viable scheme of using MR sensor for open-loop field sensing with significantly reduced adverse effects from baseline resistance shift after long time application or stress
(b) Reduction of sensing error from sensitivity change with in-situ characterization of MR sensor sensitivity Device Structures (and their Associated Methodologies):

Embodiment 1A

Approach 1

Figure 5:
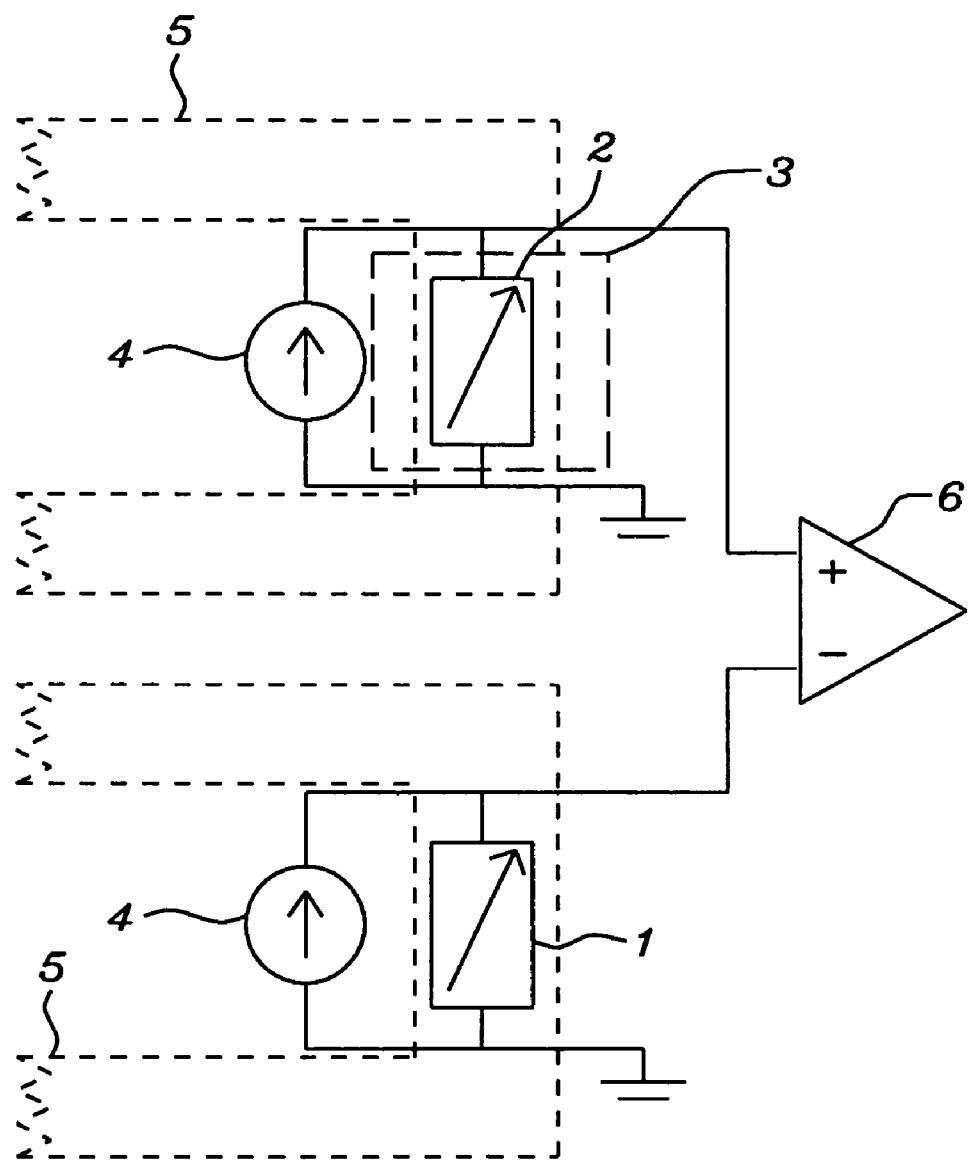
FIG. 5 shows a first embodiment of the invention.

The basic elements of the device are MR sensor 1 for sensing the unknown magnetic field and MR sensor 2 for providing a zero-field reference point for sensor 1. Magnetizing coil 5 (as shown in FIG. 5) is located in close proximity to sensors 1 and 2 and produces a magnetic field at sensors 1 and 2 when coil 5 is energized by passing an electric current through it.

Figure 6:
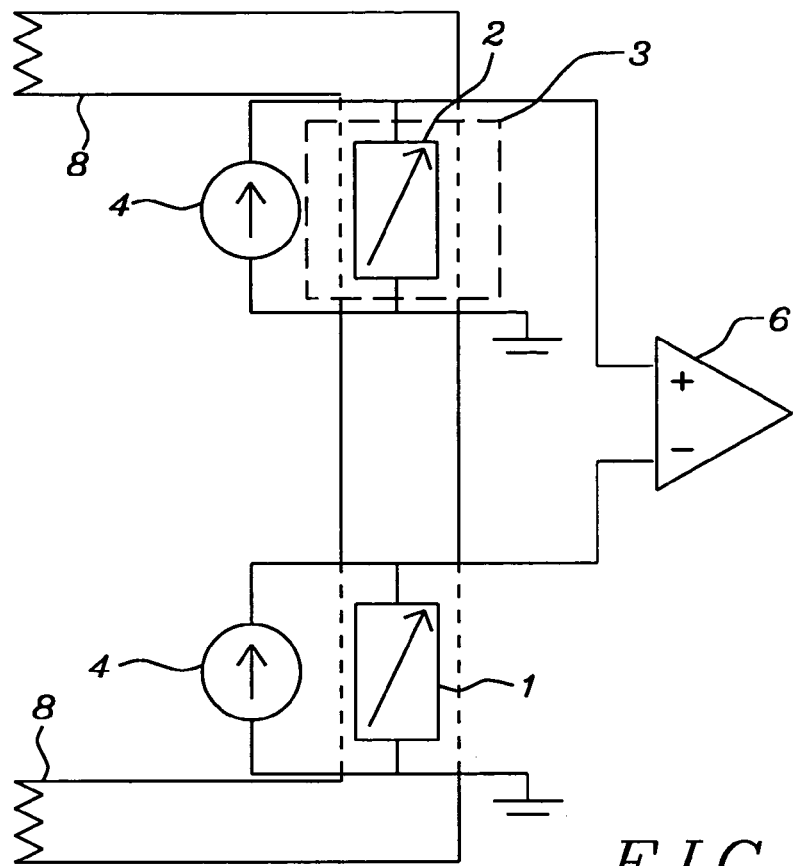
FIG. 6 shows a second embodiment of the invention.

A more compact version of the apparatus is schematically illustrated in FIG. 6 where the predetermined magnetic field is generated by passing current through a single wire. By using thin film technology, a circuit line of this type can be located within a range of from 5 to 100 nm of both MR sensors. Additionally, said circuit line can be placed directly above, directly below, or between the two MR sensors and any microprocessor needed to compute and store data generated by the sensors can be formed at the same time.

Sensor 2, and the section of coil 5 that affects sensor 2, are shielded by magnetic shielding component 3 to isolate sensor 2 from all external magnetic fields except the field from coil 5. During operation, current from current source 4 activates both sensor 1 and sensor 2 causing each sensor to produce its own voltage output. The voltages from each of the sensors are then sent to comparison circuit 6 for determining the voltage correction factor for sensor 1.

The comparison circuit enables sensor 2 to serve as a reference sensor for sensor 1. Normalization is performed within each sensor circuit separately. Once normalization has been performed, sensor 2 is returned to a zero field environment and sensor 1 is exposed to the external field that is to be measured. The voltage difference between the two sensors (as shown by the comparator circuit) is now a measure of the field that sensor 1 is experiencing.

Example

Referring to FIG. 5

(1) Coil 5 drives both sensors 1 and 2 into saturation to generate $R1_{max}$ and $R2_{max}$.
(2) Separate current sources 4 are connected to each sensor and adjusted so that $V_o$ is dropped across each sensor.
(3) Without changing the current levels through sources 4, coil 5 is de-energized.
(4) The voltage dropped across sensor 2 is now given by $V2_{0field} = (R2_{0field}/R2_{max})V_0$ since sensor 2 does not see the external field.
(5) The voltage dropped across sensor 1 is now given by $V1_{field} = (R1_{field}/R1_{max})V_0$ If sensors 1 and 2 share a common substrate, then $$R1_{0field}/R1_{max} = R2_{0field}/R2_{max}$$

So, $[sensor1voltage - sensor2voltage] = (R1_{field} - R1_{0field})V_0/R1_{max}$ (1)

which is the reason for the comparator.

Note that while aging may change any or all of $R1_{field}$, $R1_{0field}$, and $R1_{max}$ individually, the ratio expressed in equation (1) remains constant.

Sensor 1 and 2 can be any magneto-resistive sensor that has at least one magnetic free layer whose magnetization rotates in the presence of a magnetic field and produces an effective resistance change across the sensor. Examples include (but are not limited to) anisotropic magneto-resistance (AMR), spin-value giant magneto-resistance (GMR), current confined path (CCP) GMR, current perpendicular to plane (CPP) GMR, and tunneling magneto-resistance (TMR) sensors. Coil 5 is preferred to be directly above and/or below the sensor structures for optimum field production. The field from coil 5 at sensors 1 and 2 (for a given current) will be determined (and hence controlled) by factors such as the number of turns in the coil, the total thickness of the coil, the thickness of each sensor's free layer, and the accumulated thickness of the layers between the sensor's free layers and the coil. Shielding structure 3 is formed from material that is magnetically soft.

Resistance Normalization Using Methodology 1:

The magnetic field at sensors 1 and 2 (generated by coil 5) is made large enough to magnetically saturate the sensors, whether or not there is an additional external field present. Depending on the direction of the field generated by coil 5, MR sensor 1 will be in either its highest-resistance (HR) or lowest-resistance (LR) saturated state. The current supplied by source 4 is then adjusted to make the voltage across sensor 1 equal to $V_{sat}$, the latter being an arbitrary preset value (e.g. 1 volt) that is kept constant for all normalization processes.

Afterwards, the current through coil 5 is turned off, making its contribution to the magnetic environment zero thereby leaving only the external field to act on sensor 1. Once $V_{sat}$ is reached, the current is kept constant. When this current passes through sensor 1, the voltage across sensor 1 is proportional to the ratio of the sensor 1 resistance under the external field being normalized to its saturated state resistance, with a factor of $V_{sat}$. This voltage can then be utilized for measurement of the external field strength. Sensor 2 undergoes the exact normalization method as sensor 1, only that it does not experience any external magnetic field. When coil 5 field is reduced to zero, zero field condition exists in sensor 2. Thus the voltage output of sensor 2 after normalization is always proportional to the ratio of the sensor 2 resistance under the zero field being normalized to its saturated state resistance, with a factor of $V_{sat}$. This voltage can be used to serve as reference point for sensor 1.

Approach 2

It needs to be clarified that the saturated state discussed above is an example of a 'determined state'. This 'determined state' can also be understood as the angle of the effective magnetization direction of the free layer of the MR sensor, relative to its direction when the total field in the sensor is zero, being the same. One such example is that if the total magnetic field in the MR sensor can be reproduced at a given value each time before the measurement, the sensor resistance at this specific field can then also be used as the normalization factor. With the magnetic field produced by coil 5 in sensor 1 and 2 being pre-calibrated, the field strength produced by coil 5 at the same current is reasonably the same. When current in 5 is applied to generate same field in sensor 1 and 2, the external field is temporarily turned off so that the field in 1 and 2 is only the coil field, which is regarded as a determined state. Repeating the current source 4 adjustment as in approach 1, sensor 1 and 2 resistance can be normalized to the resistance at this know state.

Approach 3

Every other aspect is the same as in approach 1, except that the normalization factor on sensors 1 and 2 is not based on the resistance at one saturated state, but on a value calculated from sensor resistance at both HR and LR states. Current in coil 5 is passed in both its possible directions thereby saturating the sensors in both their HR and LR states. The current source values at both HR and LR states that was required in order to reach the same $V_{sat}$ are stored. A third current value is then calculated from the previously measured LR and HR currents as linear function of both the HR and the LR resistances. One example (of several possibilities) is the arithmetic mean of the HR and LR resistance values.

Sensitivity calibration: The magnetic field produced by the current flowing in coil 5 in sensor 1 is pre-calibrated before application of the device in field sensing. The values of the magnetic field from coil 5 in sensor 1 for at least two currents in coil 5, including zero current, are precisely known from the pre-calibration. During field sensing, the external field in sensor 1 is small enough to not exceed the saturation points of sensor 1. By applying the at least two pre-calibrated fields from coil 5 in sensor 1, the sensor's normalized resistance change due to the coil field difference can be used as a sensitivity characterization of sensor 1. With this sensitivity characterization of sensor 1, the normalized resistance difference of sensor 1 relative to sensor 2 can be used to extrapolate the external field level acting on sensor 1.

Figure 7:
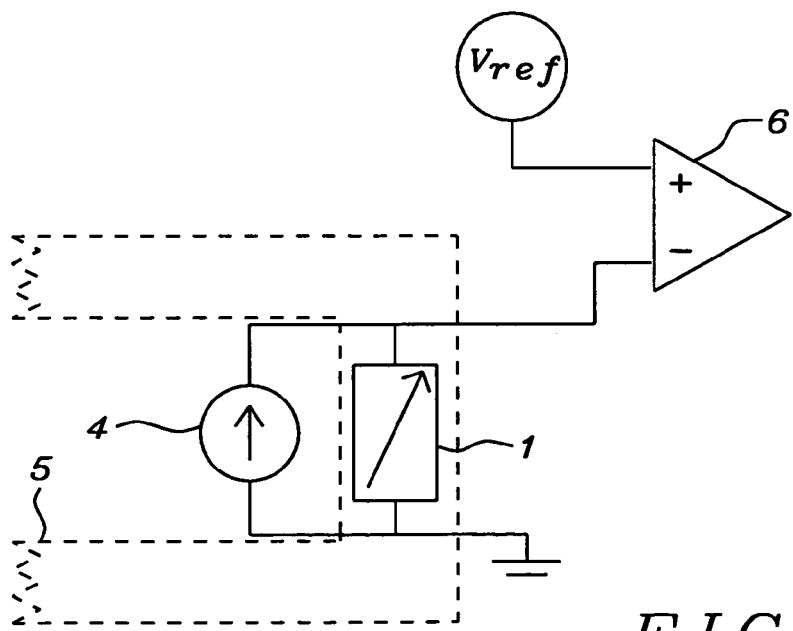
FIG. 7 shows a third embodiment of the invention.

(1) Embodiment 1B—Referring now to FIG. 7, every other aspect is the same as in Embodiment 1A, except that the reference voltage is not provided by a referencing sensor 2 that is shielded from the external field but a constant voltage that equals to the ratio of the sensor 1 resistance under the zero field being normalized to its saturated state resistance, with a factor of $V_{sat}$. In this scheme, the MR sensor 1 is assumed to have a shift of normalized resistance smaller than the minimal accuracy requirement after long time operation or stress.

(2) Embodiment 1C—Every other aspect is the same as in Embodiment 1A, except that the sensitivity calibration of sensor 1 by coil 5 field is not utilized but rather a pre-characterized sensitivity value is used for external field extrapolation. In this scheme, the MR sensor 1 is assumed to have a change of sensitivity smaller than the minimal accuracy requirement after long time operation or stress.

(3) Embodiment 1D—Every other aspect is the same as in Embodiment 1B, except that the sensitivity calibration of sensor 1 by coil 5 field is not utilized but rather a pre-characterized sensitivity value is used for external field extrapolation. In this scheme, the MR sensor 1 is also assumed to have a change of sensitivity smaller than the minimal accuracy requirement after long time operation or stress.

(4) Embodiment 2A—Every other aspect is the same as in Embodiment 1A, except that the normalization of the sensor resistance is not achieved by adjusting a current source to reach a certain voltage level as described in Embodiment 1A, but rather through certain digital or analog circuitry that can record/delay/store the resistance value of the sensors at saturated states, either directly (MR sensors' resistance values) or indirectly (voltages or currents across MR sensors). The recorded/delayed/stored resistance data are then later used to normalize the sensor resistance through another digital or analog circuitry, i.e. a division operation.

(5) Embodiment 2B—Every other aspect is the same as in Embodiment 1B, except that the normalization of the sensor resistance is not by the adjustable current source method as described in Embodiment 1A, but rather through certain digital or analog circuitry that can record/delay/store the resistance value of the sensors at saturated states, either directly (MR sensors' resistance values) or indirectly (voltages or currents across MR sensors). The recorded/delayed/stored resistance data are then later used to normalize the sensor resistance through another digital or analog circuitry, i.e. a division operation.

(6) Embodiment 2C—Every other aspect is the same as in Embodiment 1C, except that the normalization of the sensor resistance is not by the adjustable current source method as described in Embodiment 1A, but rather through certain digital or analog circuitry that can record/delay/store the resistance value of the sensors at saturated states, either directly (MR sensors' resistance values) or indirectly (voltages or currents across MR sensors). The recorded/delayed/stored resistance data are then later used to normalize the sensor resistance through another digital or analog circuitry, i.e. a division operation.

(7) Embodiment 2D—Every other aspect is the same as in Embodiment 1D, except that the normalization of the sensor resistance is not by the adjustable current source method as described in Embodiment 1A, but rather through certain digital or analog circuitry that can record/delay/store the resistance value of the sensors at saturated states, either directly (MR sensors' resistance values) or indirectly (voltages or currents across MR sensors). The recorded/delayed/stored resistance data are then later used to normalize the sensor resistance through another digital or analog circuitry, i.e. a division operation.

What is claimed is:

1. A method to correct for aging effects in a magneto-resistive (MR) magnetic field sensor having first and second MR sensors, the method comprising:
   providing a device that, when energized, generates a magnetic field inside a volume;
   locating said first and second MR sensors within said volume;
   shielding said second MR sensor from any and all magnetic fields other than magnetic fields generated by said device;
   creating in said volume a magnetic field of predetermined strength that is known to place each of said first and second MR sensors in a determined state by energizing said device, the determined state being a state of said MR magnetic field sensor that is known to change in a predictable manner as said MR magnetic field sensor ages;
   driving currents $I_{s1}$ and $I_{s2}$ from current sources through said first and second MR sensors respectively, thereby causing identical voltages $V_{1s}$ and $V_{2s}$ to be generated across said first and second MR sensors respectively;
   de-energizing said device whereby said second MR sensor experiences zero magnetic field, any magnetic field still present within said volume being an unknown magnetic field that derives from an external source;
   continuing to drive currents $I_{s1}$ and $I_{s2}$ from current sources through said first and second MR sensors thereby generating voltages $V_{u1}$ and $V_{O2}$ across said first and second MR sensors respectively; and
   computing a value for said unknown magnetic field as $V_{u1} - V_{O2}$.

2. The method recited in claim 1 wherein said magnetic field of predetermined strength, optionally supplemented by a magnetic field from an external source, provides a total magnetic field whose direction and strength are sufficient to cause both said first and said second MR sensors to be magnetically saturated and also to maximize resistance in both said first and said second MR sensors.

3. The method recited in claim 1 wherein said magnetic field of predetermined strength, optionally supplemented by a magnetic field from an external source, provides a total magnetic field whose direction and strength are sufficient to cause both said first and said second sensors to be magnetically saturated and also to minimize resistance in both said first and said second MR sensors.

4. The method recited in claim 1 wherein said first and second MR sensors are selected from the group consisting of AMR devices, CIP GMR devices, CPP GMR devices, TMR devices, CCP GMR devices, and spin polarized devices.

5. A method to correct for aging effects in a magneto-resistive (MR) magnetic field sensor having first and second MR sensors, the method comprising:
   providing a device;
   energizing said device to generates a magnetic field inside a volume;
   locating said first and second MR sensors within said volume;
   shielding said second MR sensor from any and all magnetic fields other than magnetic fields generated by said device;

energizing said device to generate a saturating magnetic field in a first direction causing said first and second MR sensors to be in maximum resistance (HR) state;

recording resistance values for said first and second MR sensors in said HR state as $R_{1sH}$ and $R_{2sH}$, respectively;

energizing said device to generate a saturating magnetic field in a second direction that opposes said first direction causing said first and second MR sensors to be in minimum resistance (LR) state;

recording resistance values for said first and second MR sensors in said LR state as $R_{1sL}$ and $R_{2sL}$, respectively; and calculating new values for $R_{1s}$ and $R_{2s}$, each of said new values being a linear arithmetic function of $R_{1sH}$ and $R_{1sL}$, and of $R_{2sH}$ and $R_{2sL}$, respectively.

6. The method recited in claim 5 wherein said linear arithmetic function is selected from the group consisting of arithmetic mean, sum, difference, and weighted arithmetic mean.

7. The method recited in claim 5 wherein said first and second MR sensors are selected from the group consisting of AMR devices, CIP GMR devices, CPP GMR devices, TMR devices, CCP GMR devices, and spin polarized devices.

8. A method to measure an external magnetic field through use of a magneto-resistive (MR) sensor, comprising:

providing a device;

energizing said device to generate a magnetic field inside a volume;

locating said MR sensor within said volume;

energizing said device to generate a magnetic field sufficient to cause said MR sensor to be in maximum resistance (HR) state;

passing a first current through said MR sensor whereby voltage $V_0$ is dropped across said MR sensor;

while maintaining said first current through said MR sensor, de-energizing said device whereby said magnetic field is reduced to zero and said voltage that is dropped across said MR sensor becomes $V_{ref}$;

measuring said external magnetic field through application of a series of steps comprising:

placing said MR sensor in said HR state;

passing a second current through said MR sensor whereby voltage $V_0$ is dropped across said MR sensor;

while continuing to pass said second current through said MR sensor, exposing said MR sensor to only said external field whereby voltage $V_{ex}$ is dropped across said MR sensor; and computing a value for said external field from $V_{ref}-V_{ex}$.

9. The method recited in claim 8 wherein said MR sensor is selected from the group consisting of AMR devices, CIP GMR devices, CPP GMR devices, TMR devices, CCP GMR devices, and spin polarized devices.

* * * * *